United States Patent [19]

Thurm et al.

[11] Patent Number: 5,552,226
[45] Date of Patent: Sep. 3, 1996

[54] PROCESS FOR PRETREATING SURFACES OF PLASTIC ITEMS

[75] Inventors: Siegfried Thurm, Meerbusch; Klaus Sommer, Bergisch Gladbach; Peter Bier, Krefeld; Andreas Elschner, Mülheim/Ruhr; Manfred Kowitz, Moers; Axel Sandquist, Monheim, all of Germany

[73] Assignee: Bayer AG, Leverkusen, Germany

[21] Appl. No.: 459,325

[22] Filed: Jun. 2, 1995

Related U.S. Application Data

[62] Division of Ser. No. 302,844, filed as PCT/EP93/00630, Mar. 17, 1993, Pat. No. 5,487,810.

[30] Foreign Application Priority Data

Mar. 26, 1992 [JP] Japan .................. 42 09 807.6
Mar. 5, 1993 [JP] Japan .................. 43 06 971.1

[51] Int. Cl.$^6$ .................................................. B32B 77/36
[52] U.S. Cl. .................... 428/412; 428/457; 428/458; 428/460; 428/461; 428/465
[58] Field of Search .................... 428/412, 457, 428/458, 460, 461, 465

[56] References Cited

U.S. PATENT DOCUMENTS

| | | | |
|---|---|---|---|
| 4,264,750 | 4/1991 | Anand et al. | 525/356 |
| 4,404,256 | 9/1983 | Anand et al. | 428/409 |
| 4,575,475 | 3/1986 | Nakayama et al. | 428/480 |

FOREIGN PATENT DOCUMENTS

| | | |
|---|---|---|
| 0109334 | 5/1984 | European Pat. Off. . |
| 0241718 | 10/1987 | European Pat. Off. . |
| 0291113 | 11/1988 | European Pat. Off. . |
| 0313855 | 5/1989 | European Pat. Off. . |
| 2461731 | 2/1981 | France . |
| 3425755 | 1/1985 | Germany . |
| 3739994 | 6/1989 | Germany . |
| WO85/00301 | 1/1985 | WIPO . |

OTHER PUBLICATIONS

Morita and Hattori; *Applications of Plasma Polymerization*, Pure and Appl. Chem. vol. 57, No. 9, pp. 1277–1286, (1985).
Abstract of J59–12943–A (Patent Abstracts of Japan; May 9, 1984).
Abstract of J59–142229–A (Aug. 1984).
Abstract of J58–147433 (Sep. 1983).
Orbit Abstract of FR2461731 (1981).
Orbit Abstract of DE3739994 (1989).
Orbit Abstract of DE3425755 (1985).

*Primary Examiner*—Bernard Lipman
*Attorney, Agent, or Firm*—Connolly & Hutz

[57] ABSTRACT

In order to improve the adhesion of coatings, especially metal coatings, to the surfaces of plastic components, the latter are pretreated in low-pressure plasma with a process gas containing sulphur hexafluoride ($SF_6$) which is substantially free of oxygen, the plastic surfaces being kept free of fluorine deposits or inclusions during the pretreatment.

8 Claims, No Drawings

PROCESS FOR PRETREATING SURFACES OF PLASTIC ITEMS

This is a divisional of Ser. No. 08/302,844, filed as PCT/EP93/00630, Mar. 17, 1993, now U.S. Pat. No. 5,487,810.

The present invention provides a process for pretreating surfaces of plastic items in a low-pressure plasma for the subsequent application of layers, especially metallic layers, wherein a process gas which contains sulphur hexafluoride (SF) is used for the low-pressure plasma, and a metallised and/or lacquered plastic item which is pretreated using the process.

The invention lies within the technical area of surface treatment of plastics. For many applications of this type of item, it is desirable to specially coat these on the surface. One of the most frequent applications here is the application of metallic layers, especially aluminium layers. A particular difficulty when perform in this type of coating operation is the generally low degree of adhesion between the applied layer and the plastic item. In order to improve this adhesion, it is known that the plastic item may be subjected to a plasma treatment.

Thus, for example, a method for metallising a plastic substrate is known from U.S. Pat. No. 3,686,018. The plastic substrate is treated to improve the adhesion by means of a low-pressure gas discharge which preferably contains oxygen as a process gas. Furthermore, a process for preparing barrier layers of amorphous plastic on polycarbonate, polyethylene or polypropylene substrates, in which the plastic surface is treated with a gas plasma which preferably contains argon, is known from U.S. Pat. No. 4,756,964. A process for treating fluorine-free polymers, in which the surface of the polymers is fluorinated by treatment with fluorine-containing gases in a low temperature plasma, is known from U.S. Pat. Nos. 4,264,750 and 4,404,256. Satisfactory adhesion of the subsequent metallic layer cannot be produced by using this known process, in which the fluorine is embedded into the surface, especially in the case of polycarbonate which is resistant to high temperatures.

Thus, the object is to find a process for the surface treatment of plastic items by means of which the adhesion of subsequent layers can be improved.

This object is achieved by having no oxygen in the process gas and keeping the plastic surface free of adsorbed or included fluorine during pretreatment.

Low-pressure plasmas and their production have been known for a long time. They are characterised in that the pressure in the chamber in which plasma treatment is performed is below atmospheric pressure. In the specialist field, a low-pressure plasma is frequently also called a low-temperature plasma because the plastic surface is subjected to a temperature of at most up to 200° C. Low-pressure plasma treatment is characterised by the parameters, process pressure, electrical power and process time, and by the process gas used. Known process gases are, for example, oxygen, air, the noble gases, nitrogen and tetrafluoromethane.

The new process is advantageously performed in the same vacuum unit in which the metallic layer which is intended to adhere well to the plastic item is subsequently applied. Typical process pressures are between 0.1 Pa and 1000 Pa, preferably between 1.0 Pa and 50 Pa. In the process according to the invention, pure $SF_6$ or a mixture of $SF_6$ and other oxygen-free gases, preferably noble gases, is used as the process gas.

In this case, the proportion of sulphur hexafluoride is preferably at least 50%.

The plasma is activated by an electrical field using frequencies of up to 10 GHz, wherein the preferred frequency range is between 0 and 30 MHz.

The process time for pretreatment in the low-pressure plasma is preferably 0.5 to 5 minutes.

The process can preferably be applied to polycarbonates or blends and copolymers of this plastic. In comparison to the known processes, the new process shows a special improvement for polycarbonates which are resistant to high temperatures, such as are known, for example, from DE 3 832 396-A1. They are based on dihydroxydiphenylcycloalkanes, wherein the cycloalkanes are preferably substituted by methyl groups, especially in the 3 or 3,3 position.

After the plastic items have been treated in the manner according to the invention, a metallic layer, in a preferred example aluminium, is applied. The thickness of the layer is 1 nm to 100 000 nm, preferably 10 nm to 10 000 nm. Processes for applying metallic layers are known from the literature. Vapour deposition, sputtering, ionic plating, plasma CVD (chemical vapour deposition) etc., which are familiar to the person skilled in the art, are suitable. Suitable plastic items which may be pretreated by the process according to the invention are, for example, plates, reflectors for car headlights and moulded items of any type or dimension, e.g. housings for equipment and films for packaging and decorative purposes.

The invention also provides a metallised and/or lacquered plastic item with pretreatment in accordance with the process according to one of claims 1 to 4, characterised in that the pretreated surface is free of fluorine and that the adhesion of the metallic and/or lacquer layer applied withstands a pull-off force of 7N/cm.

The metallised and/or lacquered plastic item, especially in the form of a reflector, preferably consists of a polycarbonate, especially a polycarbonate based on dihydroxydiphenylcycloalkanes which is resistant to high temperatures

EXAMPLES

The following plastics were used by way of example to explain the invention:

A=polycarbonate based on bisphenol A

B=polycarbonate based on hydrogenated isophorone

C=a blend of a polycarbonate based on bisphenol A and acrylobutadienestyrene.

The area of the samples pretreated by the process according to the invention was 11×15 cm.

Aluminium (Al) was used as a metal whose adhesion to the plastic item is intended to be improved. This was applied by vapour deposition on the plastic item.

The adhesion of the Al layer applied after pretreatment was tested by the so-called adhesive tape test. Here, adhesive tapes with a width of 20 mm and a length of ca. 80 mm were applied to the samples being tested.

To assess the adhesion, adhesive tapes with specific pull-off forces, from the manufacturer Beiersdorf AG, Hamburg, were used:

| Type | Pull-off force (N/cm) |
| --- | --- |
| 4106 | 5 |
| 4133 | 7 |

Using these tapes, it is possible to differentiate the strength of adhesion of the metallic layers to the plastic moulded items. The extent to which the Al layer was torn off was assessed in four steps: 0=Al layer did not tear off 1=Al layer torn off in small areas 2=Al layer torn off to <50% 3=Al layer torn off to ≧50%

To test the effect of the plasma treatment, a surface of plastic B which had been treated according to the invention was investigated using the ESCA process (Ullmanns Encyclopädie der technischen Chemie, 4th ed. vol. 5, "Analysen- und Messverfahren", p. 522, Verlag Weinheim; Deerfield Beach, Fla., Basel), in order to determine the effect of pretreatment on the chemical composition. Surprisingly, it was found that not fluorine, but sulphur, was embedded in the surface of the previously sulphur-free polymer due to the process according to the invention. The results are given in Table 2. It should be noted that hydrogen cannot be detected using the ESCA process.

Example 1

The sample types A, B and C mentioned at the beginning were fastened to a rotatable substrate holder in a vapour deposition unit A 600 supplied by Leybold Heraeus, Hanau, Germany. Then the process chamber in the vapour deposition unit was sealed and evacuated to ca. 0.01 Pa. Then $SF_6$ was introduced up to a pressure of 7 Pa. The pressure was measured using a capacitance manometer which was independent of the type of gas. The rotary drive for the substrate holder was then switched on so that it rotated at 20 rpm. A low-pressure plasma was set up by applying a voltage of −475 V with respect to earth to an Al plate connected as the cathode. The samples were treated in this plasma for 2 minutes at a power of 3.8 Watts. The voltage was then switched off, the addition of $SF_6$ stopped and the process chamber evacuated to 0.01 Pa.

After reaching this pressure, the electron beam gun was switched on and the aluminium to be vaporised, which was located in a graphite crucible, was heated to ca. 1500K within 180 sec using a power of 2 kW. Next, a moveable screen between the electron beam gun and the substrate holder was removed and the moulded item was coated for 80 sec at a rate of 1 nm/s. Then the screen was replaced between the electron beam gun and the substrate holder and the coating process terminated. After switching off the electron beam gun and cooling the vaporising material, the process chamber was ventilated for ca. 10 minutes and the coated plastic was withdrawn. The adhesion of the metallic layer was tested using the process mentioned above. The results are given in Table 1 at the end of the examples. It can be seen that the metallic layer could not be loosened from any of the plastics tested, i.e. it possessed good adhesive powers.

Example 2

(comparison example)

Plastic items were pretreated in a low-pressure plasma in the same way as in example 1. Ar was used as the process gas. All the other process parameters remained the same. Application of the Al layer and testing the adhesion took place as described in example 1. The results are given in Table 1. This shows that using adhesive tape 4106, which has a pull-off force of 5N/cm, the adhesion of the layer was very good with sample A and satisfactory with samples B and C. When tested with adhesive tape 4133, which has a pull-off force of 7N/cm, however, there was much poorer adhesion of the metal layer, as compared with the values from example 1.

Example 3

(comparison example)

Plastic items were pretreated in a low-pressure plasma in the same way as in example 1. $CF_4$ was used as the process gas, wherein fluorine was deposited on the surface. All the other process parameters remained the same. Application of the Al layer and testing the adhesion took place as described in example 1. The results are given in Table 1. This shows that the Al layer had unsatisfactory adhesion.

Example 4

(comparison example)

Plastic items like those in the previous examples were directly covered with Al vapour in a low-pressure plasma, without any pretreatment. The results are summarised in Table 1 below and show that the Al layer had unsatisfactory adhesion when using both adhesive tapes.

TABLE 1

|  |  | Adhesion | | | | | |
|---|---|---|---|---|---|---|---|
|  |  | Adhesive tape 4106 Sample | | | Adhesive tape 4133 Sample | | |
| Example | Process gas | A | B | C | A | B | C |
| 1 | $SF_6$ | 0 | 0 | 0 | 0 | 0 | 0 |
| 2 | Ar | 0 | 2 | 2 | 2 | 3 | 3 |
| 3 | $CF_4$ | 3 | 3 | 3 | 3 | 3 | 3 |
| 4 | — | 2 | 3 | 2 | 3 | 3 | 3 |

TABLE 2

|  |  | Components (at. %) | | | |
|---|---|---|---|---|---|
| Example | Process gas | C | O | F | S |
| 1 | $SF_6$ | 81 | 18 | 0 | 1 |
| 2 | Ar | 81 | 19 | 0 | 0 |
| 3 | $CF_4$ | 80 | 17 | 3 | 0 |
| 4 | — | 86.5 | 13.5 | 0 | 0 |

We claim:

1. Plastic items with a pretreated surface which is free of fluorine, formed by a process for pretreating the surface of plastic items in a low-pressure plasma for the subsequent application of layers, wherein a process gas is used for the low-pressure plasma which contains sulphur hexaflouride ($SE_6$), further wherein this process gas is kept essentially free of oxygen and the plastic surface is kept free of adsorbed or included fluorine during pretreatment and after said layer is applied to the surface of the plastic item, the adhesion of the applied layer withstands an adhesive tape test with a pull-off force of 7N/cm.

2. A plastic item, according to claim 1 characterised in that it consists of polycarbonate which is resistant to high temperatures.

3. A plastic item according to claim 1, wherein said layer is a metallic layer.

4. A plastic item according to claim 1, wherein said layer is a lacquer layer.

5. A plastic item according to claim 2, wherein said plastic item is a reflector.

6. A plastic item according to claim 2, wherein said polycarbonate is based on dihydroxydiphenylcycloalkanes.

7. A plastic item according to claim 2, wherein said layer is a metallic layer.

8. A plastic item according to claim 2, wherein said layer is a lacquer layer.

* * * * *

UNITED STATES PATENT AND TRADEMARK OFFICE
CERTIFICATE OF CORRECTION

PATENT NO. : 5,552,226
DATED : September 3, 1996
INVENTOR(S) : Thurm, et. al.

It is certified that error appears in the above-indentified patent and that said Letters Patent is hereby corrected as shown below:

Title page,

In the Foreign Application Priority Data section [30],

"Mar. 26, 1992 [JP] Japan.........................42 09 807.6
Mar. 5, 1993 [JP] Japan.........................43 06 971.1"

should read,

--Mar. 26, 1992 [DE] Germany.......................42 09 807.6
Mar. 5, 1993 [DE] Germany.......................43 06 971.1--.

In Column 4, line 45 (Claim 1), "($SE_6$)," should be --($SF_6$),--.

Signed and Sealed this

Nineteenth Day of November, 1996

*Attest:*

BRUCE LEHMAN

*Attesting Officer*     *Commissioner of Patents and Trademarks*